United States Patent
Kim et al.

(10) Patent No.: US 11,094,778 B2
(45) Date of Patent: *Aug. 17, 2021

(54) CAPACITOR WITH HIGH WORK FUNCTION INTERFACE LAYER

(71) Applicant: SK hynix Inc., Gyeonggi-do (KR)

(72) Inventors: Beom-Yong Kim, Gyeonggi-do (KR); Deok-Sin Kil, Gyeonggi-do (KR); Hee-Young Jeon, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/877,797

(22) Filed: May 19, 2020

(65) Prior Publication Data
US 2020/0279906 A1 Sep. 3, 2020

Related U.S. Application Data

(63) Continuation of application No. 16/418,597, filed on May 21, 2019, now Pat. No. 10,700,162, which is a continuation of application No. 16/002,866, filed on Jun. 7, 2018, now Pat. No. 10,347,711.

(30) Foreign Application Priority Data

Nov. 28, 2017 (KR) .......................... 10-2017-0160654

(51) Int. Cl.
| | |
|---|---|
| H01L 21/8242 | (2006.01) |
| H01L 49/02 | (2006.01) |
| H01G 4/12 | (2006.01) |
| H01G 4/005 | (2006.01) |

(52) U.S. Cl.
CPC ............. *H01L 28/60* (2013.01); *H01G 4/005* (2013.01); *H01G 4/1263* (2013.01)

(58) Field of Classification Search
None
See application file for complete search history.

(56) References Cited

U.S. PATENT DOCUMENTS

| | | | | |
|---|---|---|---|---|
| 10,700,162 B2 * | 6/2020 | Kim | ....................... | H01G 4/005 |
| 2011/0254122 A1 * | 10/2011 | Noda | ..................... | H01L 27/10 |
| | | | | 257/530 |

* cited by examiner

*Primary Examiner* — Hung K Vu
(74) *Attorney, Agent, or Firm* — IP & T Group LLP

(57) ABSTRACT

A method for fabricating a capacitor includes: forming a bottom electrode; forming a dielectric layer on the bottom electrode; forming a metal oxide layer including a metal having a high electronegativity on the dielectric layer; forming a sacrificial layer on the metal oxide layer to reduce the metal oxide layer to a metal layer; and forming a top electrode on the sacrificial layer to convert the reduced metal layer into a high work function interface layer.

18 Claims, 15 Drawing Sheets

CAPACITOR WITH HIGH WORK FUNCTION INTERFACE LAYER

CROSS-REFERENCE TO RELATED APPLICATIONS

This application is a continuation of U.S. patent application Ser. No. 16/418,597 filed on May 21, 2019, which is a continuation of U.S. patent application Ser. No. 16/002,866 filed on Jun. 7, 2018 and issued as U.S. Pat. No. 10,347,711 on Jul. 9, 2019, which claims benefits of priority of Korean Patent Application No. 10-2017-0160654 filed on Nov. 28, 2017. The disclosure of each of the foregoing application is incorporated herein by reference in its entirety.

BACKGROUND

1. Field

Exemplary embodiments of the present invention relates generally to a semiconductor device and a method for fabricating the same. More particularly, the present invention relates to a semiconductor device including a capacitor and a method for fabricating the semiconductor device.

2. Description of the Related Art

A capacitor of a semiconductor device may include a bottom electrode, a dielectric layer, and a top electrode. As the degree of integration of a semiconductor device increases, the thickness of the dielectric layer decreases which may result in increased leakage current. Increasing the thickness of the dielectric layer to reduce the leakage current leads to an increase in the equivalent oxide layer thickness ($T_{ox}$).

SUMMARY

Exemplary embodiments of the present invention are directed to a semiconductor device including a capacitor which has improved leakage current characteristics, and a method for fabricating the semiconductor device.

In accordance with an embodiment of the present invention, a method for fabricating a capacitor includes: forming a bottom electrode; forming a dielectric layer on the bottom electrode; forming a metal oxide layer including a metal having a high electronegativity on the dielectric layer; forming a sacrificial layer on the metal oxide layer to reduce the metal oxide layer to a metal layer; and forming a top electrode on the sacrificial layer to convert the reduced metal layer into a high work function interface layer.

The forming of the sacrificial layer on the metal oxide layer may be performed under a hydrogen gas atmosphere.

The forming of the sacrificial layer on the metal oxide layer may include: forming a silicon layer on the metal oxide layer using a hydrogen-containing silicon source gas under a hydrogen gas atmosphere.

The forming of the sacrificial layer on the metal oxide layer may include: forming a doped silicon layer on the metal oxide layer using a hydrogen-containing silicon source gas and a hydrogen-containing dopant gas under a hydrogen gas atmosphere.

The forming of the sacrificial layer on the metal oxide layer may include: forming a silicon oxide layer on the metal oxide layer; and forming a silicon layer on the silicon oxide layer using a hydrogen-containing silicon source gas under a hydrogen gas atmosphere.

The forming of the silicon oxide layer on the metal oxide layer may include: forming a laminate structure by alternatively depositing the metal oxide layer and the silicon oxide layer.

The forming of the top electrode on the sacrificial layer may include: forming a silicon germanium layer doped with an impurity on the sacrificial layer.

The forming of the top electrode on the sacrificial layer may be performed at a temperature such that the sacrificial layer and the reduced metal layer react to form a metal silicide layer or a metal germanide.

The metal oxide layer may include a nickel oxide, the reduced metal layer may include a nickel layer, and the high work function interface layer may include a nickel silicide or a nickel-rich nickel silicide.

The metal oxide layer may include a cobalt oxide, the reduced metal layer may include a cobalt layer, and the high work function interface layer may include a cobalt silicide or a cobalt-rich cobalt silicide.

The metal oxide layer may include a tungsten oxide, the reduced metal layer may include a tungsten layer, and the high work function interface layer may include a tungsten silicide or a tungsten-rich silicide.

The forming of the sacrificial layer on the metal oxide layer may include: forming a germanium layer on the metal oxide layer using a hydrogen-containing germanium source gas under a hydrogen gas atmosphere.

The forming of the sacrificial layer on the metal oxide layer may include: forming a doped germanium layer on the metal oxide layer using a hydrogen-containing germanium source gas and a hydrogen-containing dopant gas under a hydrogen gas atmosphere.

The forming of the sacrificial layer on the metal oxide layer may include: forming a germanium oxide layer on the metal oxide layer; and forming a germanium layer on the germanium oxide layer using a hydrogen-containing germanium source gas under a hydrogen gas atmosphere.

The forming of the germanium oxide layer on the metal oxide layer may include: forming a laminate structure by alternatively depositing the metal oxide layer and the germanium oxide layer.

The metal oxide layer may include a nickel oxide, the reduced metal layer may include a nickel layer, and the high work function interface layer may include a nickel germanide.

The metal oxide layer may include a cobalt oxide, the reduced metal layer may include a cobalt layer, and the high work function interface layer may include a cobalt germanide.

The metal oxide layer may include a tungsten oxide, the reduced metal layer may include a tungsten layer, and the high work function interface layer may include a tungsten germanide.

The dielectric layer may include a zirconium oxide, an aluminum oxide, or a combination thereof.

The bottom electrode may include a titanium nitride, and the top electrode may include a boron-doped silicon germanium layer.

In accordance with an embodiment of the present invention, a capacitor includes: a bottom electrode; a dielectric layer formed on the bottom electrode; a high work function interface layer formed on the dielectric layer; and a top electrode including a silicon germanium layer formed on the high work function interface layer, wherein the high work function interface layer includes a silicide having a high electronegativity or a germanide having a high electronegativity.

The high work function interface layer may include a nickel silicide or a nickel-rich nickel silicide.

The high work function interface layer may include a cobalt silicide, a cobalt-rich cobalt silicide, a tungsten silicide, or a tungsten-rich tungsten silicide.

The high work function interface layer may include a nickel germanide, a cobalt germanide, or a tungsten germanide.

The top electrode may include a boron-doped silicon germanium layer.

The dielectric layer may include a zirconium oxide, an aluminum oxide, or a combination thereof.

The bottom electrode may have a cylindrical shape or a pillar shape.

The bottom electrode may include a titanium nitride.

DETAILED DESCRIPTION

Figure 1A:
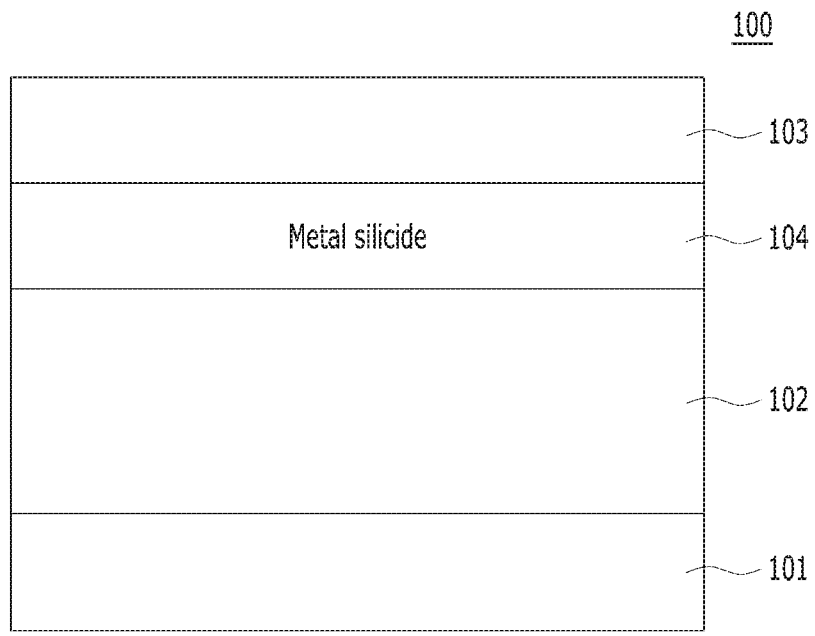
FIG. 1A is a cross-sectional view of a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Hereafter, the embodiments of the present invention are described in detail. To simplify the description, a Dynamic Random Access Memory (DRAM) device is taken as an example, but the concept and spirit of the present invention are not limited to the DRAM only, and they may be applied to other memory devices or semiconductor devices.

The embodiments described below are directed to an interface layer and a top electrode having a high work function of approximately 4.9 eV or higher while preventing a reduction of a dielectric layer.

FIG. 1A is a cross-sectional view of a semiconductor device 100 in accordance with an embodiment of the present invention.

Referring to FIG. 1A, the semiconductor device 100 may include a first conductive layer 101, a dielectric layer 102, and a second conductive layer 103.

The first conductive layer 101 may be formed of a silicon-containing material and/or a metal-containing material. For example, the first conductive layer 101 may be or include polysilicon, a metal, a metal nitride, a conductive metal oxide or combinations thereof. In some embodiments, the first conductive layer 101 may be or include doped polysilicon, titanium (Ti), a titanium nitride (TiN), a tantalum nitride (TaN), tungsten (W), a tungsten nitride (WN), ruthenium (Ru), iridium (Ir), a ruthenium oxide, an iridium oxide or combinations thereof.

The dielectric layer 102 may be formed of a high-k material. The dielectric layer 102 may be or include a high-k material having a dielectric constant that is higher than the dielectric constant of a silicon oxide. Examples of suitable high-k materials may include a hafnium oxide ($HfO_2$), a zirconium oxide ($ZrO_2$), an aluminum oxide ($Al_2O_3$), a titanium oxide ($TiO_2$), a tantalum oxide ($Ta_2O_5$), a niobium oxide ($Nb_2O_5$) or a strontium titanium oxide ($SrTiO_3$). According to another embodiment of the present invention, the dielectric layer 102 may be a composite layer including two or more layers made of a high-k material. According to an embodiment of the present invention, the dielectric layer 102 may be formed of a zirconium oxide-based material having fine leakage current characteristics while sufficiently decreasing an equivalent oxide layer thickness. For example, in some embodiments the dielectric layer 102 may be or include a ZAZ ($ZrO_2/Al_2O_3/ZrO_2$) or a ZAZA ($ZrO_2/Al_2O_3/ZrO_2/Al_2O_3$). According to other embodiments of the present invention, the dielectric layer 102 may be or include a HAH ($HfO_2/Al_2O_3/HfO_2$). According to yet other embodiments of the present invention, the dielectric layer 102 may be or include one of the following multi-layer structures $TiO_2/ZrO_2/Al_2O_3/ZrO_2$, $TiO_2/HfO_2/Al_2O_3/HfO_2$, $Ta_2O_5/ZrO_2/Al_2O_3/ZrO_2$ or $Ta_2O_5/HfO_2/Al_2O_3/HfO_2$.

The second conductive layer 103 may be formed of a non-metal material. For example, the second conductive layer 103 may be formed of a silicon-containing material, a germanium-containing material or a combination thereof. In some embodiments, the second conductive layer 103 may include a silicon (Si) layer, a germanium (Ge) layer, a silicon germanium (SiGe) layer or combinations thereof. In some embodiments, the second conductive layer 103 may have a multi-layer structure (SiGe/Si) formed by stacking the silicon germanium layer on the silicon layer. In other embodiments, the second conductive layer 103 may have a multi-layer structure (SiGe/Ge) formed by stacking the silicon germanium layer on the germanium layer.

An interface layer 104 may be formed between the dielectric layer 102 and the second conductive layer 103. The interface layer 104 may be formed of a conductive material. The interface layer 104 may be or include a high work function material. The interface layer 104 may be qualified as a "high work function interface layer." For example, the interface layer 104 may include a metal silicide. The interface layer 104 may include a silicide whose electronegativity is high. In some embodiments, the interface layer 104 may include a nickel silicide, a cobalt silicide or a tungsten silicide.

A stack structure of the first conductive layer 101, the dielectric layer 102, the interface layer 104 and the second conductive layer 103 may become a capacitor.

Figure 1B:
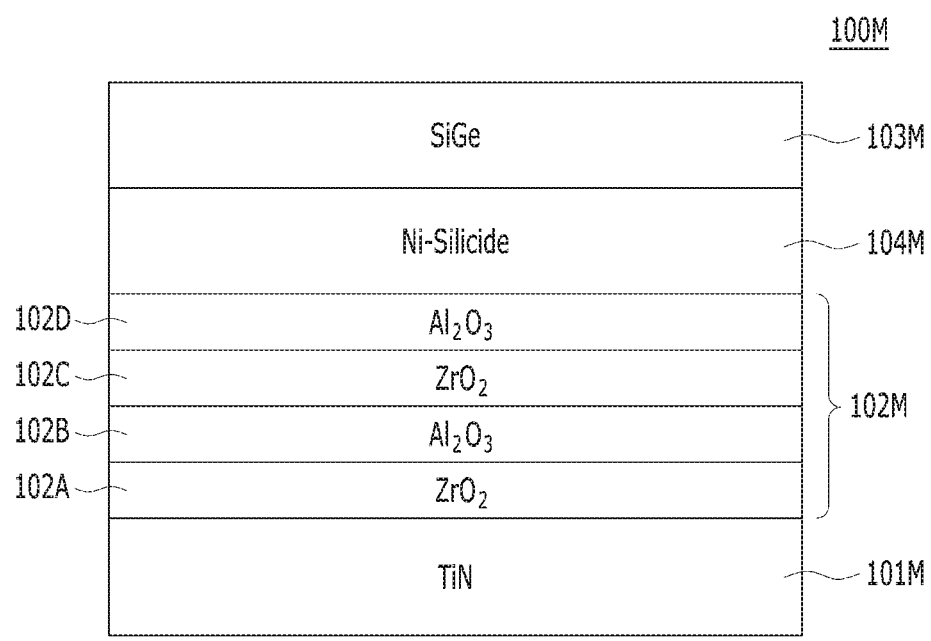
FIGS. 1B and 1C are cross-sectional views of a capacitor as an application example of the semiconductor device in accordance with an embodiment of the present invention.

FIG. 1B is a cross-sectional view of a capacitor 100M as an application example of the semiconductor device in accordance with an embodiment of the present invention.

Referring to FIG. 1B, the capacitor 100M may include a bottom electrode 101M, a dielectric layer 102M, an interface layer 104M, and a top electrode 103M.

The bottom electrode 101M may be formed of a metal nitride. For example, the bottom electrode 101M may be formed, for example, of a titanium nitride (TiN).

The top electrode 103M may be formed, for example, of a silicon germanium (Site) layer. The silicon germanium layer may be doped with a dopant, for example, boron.

The dielectric layer 102M may have a ZAZ ($ZrO_2/Al_2O_3/ZrO_2$) stack structure. The dielectric layer 102M may include a first zirconium oxide 102A, an aluminum oxide 102B and a second zirconium oxide 102C which are sequentially stacked. The dielectric layer 102M may further include an aluminum oxide 102D formed on the second zirconium oxide 102C. This structure is referred to as a ZAZA stack structure. The aluminum oxide 102D, which is a material with a large bandgap, may improve a leakage current. According to another embodiment, $SiO_2$ may be employed as a large bandgap material instead of aluminum oxide 102D.

The interface layer 104M may be formed, for example, a nickel silicide (Ni-Silicide).

Figure 1C:
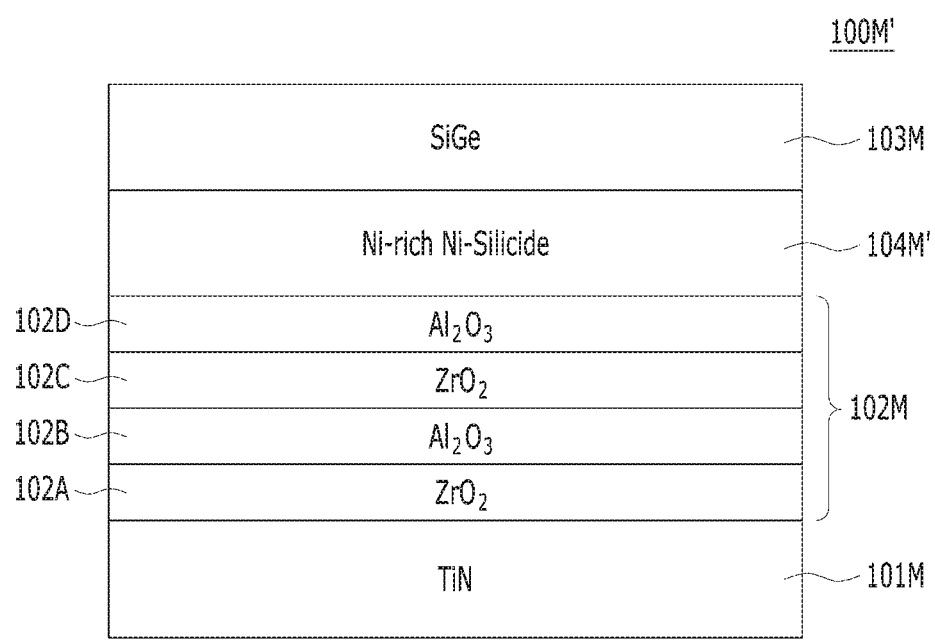

FIG. 1C is a cross-sectional view of a capacitor 100M' as an application example of the semiconductor device in accordance with an embodiment of the present invention.

Referring to FIG. 1C, the capacitor 100W may include a bottom electrode 101M, a dielectric layer 102M, an interface layer 104M', and a top electrode 103M. Hence, the capacitor 100M' may be identical to the capacitor 100M of FIG. 1B except for the interface layer 104M'. Specifically, the bottom electrode 101M may be formed of a metal nitride. For example, the bottom electrode 101M may be formed, for example, of a titanium nitride (TiN).

The top electrode 103M may be formed, for example, of a silicon germanium (Site) layer. The silicon germanium layer may be doped with a dopant, for example, boron.

The dielectric layer 102M may have a ZAZ ($ZrO_2/Al_2O_3/ZrO_2$) stack structure. The dielectric layer 102M may include a first zirconium oxide 102A, an aluminum oxide 102B and a second zirconium oxide 102C which are sequentially stacked. The dielectric layer 102M may further include an aluminum oxide 102D formed on the second zirconium oxide 102C. This structure is referred to as a ZAZA stack structure. The aluminum oxide 102D, which is a material with a large bandgap, may improve a leakage current. According to another embodiment, $SiO_2$ may be employed as a large bandgap material instead of aluminum oxide 102D.

The interface layer 104W may include a nickel-rich nickel silicide (Ni-rich Ni-Silicide). The nickel-rich nickel silicide refers to a nickel silicide where the number of nickel atoms is greater than the number of silicon atoms. For example, nickel-rich nickel silicide include $Ni_3Si$, $Ni_2Si$, and $Ni_3Si_2$.

FIGS. 2A to 2D are cross-sectional views illustrating an example of a method for fabricating the semiconductor device 100 in accordance with an embodiment of the present invention.

Figure 2A:
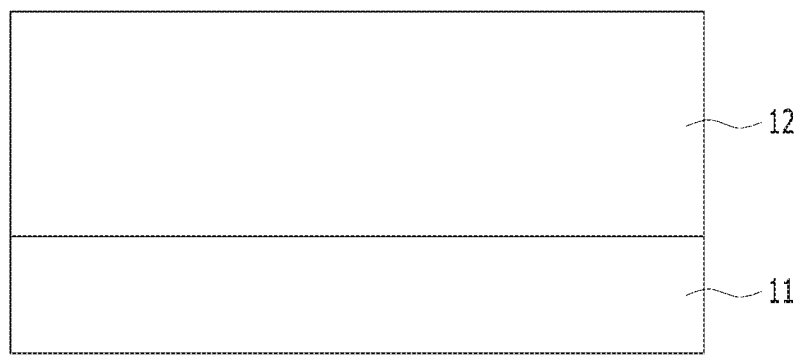
FIGS. 2A to 2D are cross-sectional views illustrating an example of a method for fabricating the semiconductor device in accordance with an embodiment of the present invention.

Referring to FIG. 2A, a first conductive layer 11 may be formed. The first conductive layer 11 may be formed of a silicon-containing material and/or a metal-containing material. For example, the first conductive layer 11 may include polysilicon, a metal, a metal nitride, a conductive metal oxide or combinations thereof. In some embodiments, the first conductive layer 11 may include doped polysilicon, titanium (Ti), a titanium nitride (TiN), a tantalum nitride (TaN), tungsten (W), a tungsten nitride (WN), ruthenium (Ru), iridium (Ir), a ruthenium oxide, an iridium oxide, etc. In an embodiment, the first conductive layer 11 may be formed, for example, by Chemical Vapor Deposition (CVD), Atomic Layer Deposition (ALD) or any other suitable method.

A dielectric layer 12 may be formed on the first conductive layer 11. The dielectric layer 12 may be formed of a high-k material. The dielectric layer 12 may be formed of a high-k material having a dielectric constant that is higher than the dielectric constant of a silicon oxide. In some embodiments, the dielectric layer 12 may include a hafnium oxide ($HfO_2$), a zirconium oxide ($ZrO_2$), an aluminum oxide ($Al_2O_3$), a titanium oxide ($TiO_2$), a tantalum oxide ($Ta_2O_5$), a niobium oxide ($Nb_2O_5$) or a strontium titanium oxide ($SrTiO_3$). According to another embodiment of the present invention, the dielectric layer 12 may be a composite layer including two or more layers of the aforementioned high-k materials. According to an embodiment of the present invention, the dielectric layer 12 may be formed of a zirconium oxide-based material having fine leakage current characteristics while sufficiently reducing an equivalent oxide layer thickness. For example, the dielectric layer 12 may include a ZAZ ($ZrO_2/Al_2O_3/ZrO_2$) or a ZAZA ($ZrO_2/Al_2O_3/ZrO_2/Al_2O_3$) structure. According to another embodiment of the present invention, the dielectric layer 12 may include a HAH ($HfO_2/Al_2O_3/HfO_2$) structure. According to yet another embodiment of the present invention, the dielectric layer 12 may be one of the following multi-layer structures $TiO_2/ZrO_2/Al_2O_3/ZrO_2$, $TiO_2/HfO_2/Al_2O_3/HfO_2$, $Ta_2O_5/ZrO_2/A_2O_3/ZrO_2$ or $Ta_2O_5/HfO_2/Al_2O_3/HfO_2$.

Figure 2B:
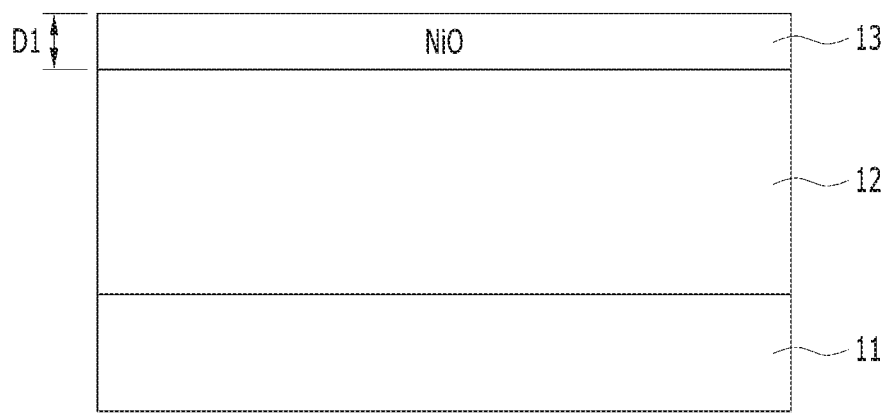

Referring to FIG. 2B, a sacrificial interface layer 13 may be formed on the dielectric layer 12. The sacrificial interface layer 13 may include an easily-reduced chemical species of oxide. The sacrificial interface layer 13 may include a chemical species of oxide whose electronegativity is high. The sacrificial interface layer 13 may include an easily-reduced chemical species of oxide whose electronegativity is high. The sacrificial interface layer 13 may be 2 nm or less in thickness D1.

According to an embodiment of the present invention, the sacrificial interface layer 13 may include an easily-reduced metal oxide whose electronegativity is high. For example, the sacrificial interface layer 13 may be a nickel-containing layer. In an embodiment, the sacrificial interface layer 13 may include an oxide containing nickel, i.e., a nickel oxide (NiO). The electronegativity of nickel may be approximately 1.91. According to another embodiment of the present invention, the sacrificial interface layer 13 may be made of or include a cobalt oxide or a tungsten oxide. The electronegativity of cobalt may be approximately 1.8, and the electronegativity of tungsten may be approximately 1.7.

Generally, a work function of a material relates to the electronegativity of an element or elements making up the material. For example, an element having a higher electronegativity has a larger work function, and an element having a lower electronegativity has a smaller work function. In case of a metal, the electronegativity increases through oxidation.

Figure 2C:
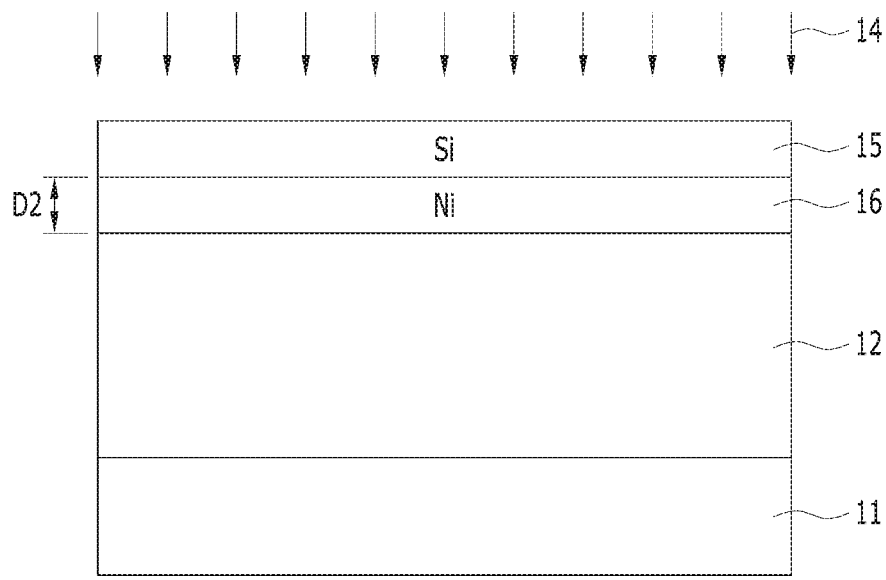

Referring to FIG. 2C, the sacrificial interface layer 13 may be exposed to a reducing atmosphere 14 to reduce the sacrificial interface layer 13 and form an initial interface layer 16. The reducing atmosphere 14 may include a hydrogen gas. In an embodiment, the initial interface layer 16 may be formed by depositing a sacrificial silicon layer 15 at the hydrogen gas reducing atmosphere.

The sacrificial silicon layer 15 may be deposited under the reducing atmosphere 14 including the hydrogen gas. Since hydrogen has great reducing power, the sacrificial interface layer 13 may be reduced when the sacrificial silicon layer 15 is deposited. A material remaining due to the reduction of the sacrificial interface layer 13 is qualified as an initial interface layer 16 for short. When the sacrificial interface layer 13 is formed of a metal oxide, the metal oxide may be reduced to a metal by hydrogen. For example, when the sacrificial interface layer 13 is formed, for example, a nickel oxide (NiO), nickel (Ni) may be formed by a reduction of the nickel oxide (NiO). The initial interface layer 16 may have high electronegativity. When the sacrificial silicon layer 15 is formed under the reducing atmosphere 14 of hydrogen gas, the sacrificial silicon layer 15 can be deposited at a low temperature. For example, the sacrificial silicon layer 15 is formed at a low temperature of 450° C.

The sacrificial silicon layer 15 may be or include a doped silicon layer. For example, the sacrificial silicon layer 15 may be a silicon layer doped with boron. The sacrificial silicon layer 15 may be formed by a CVD method. The sacrificial silicon layer 15 may be deposited using a hydrogen-containing silicon source gas under the reducing atmosphere 14 including the hydrogen gas. According to another embodiment of the present invention, the sacrificial silicon layer 15 may be deposited using the hydrogen-containing silicon source gas and a hydrogen-containing dopant gas under the reducing atmosphere 14 including the hydrogen gas. The hydrogen-containing silicon source gas may include silane ($SiH_4$) or disilane ($Si_2H_6$). The hydrogen-containing dopant gas may include boron, borane ($BH_3$), diborane ($B_2H_6$) or any combinations thereof. In this manner, the hydrogen-containing silicon source gas and the hydrogen-containing dopant gas, which are as compounds containing hydrogen, may promote the reduction of the sacrificial interface layer 13.

As described above, when the sacrificial silicon layer 15 is formed, the sacrificial interface layer 13 is reduced so that the initial interface layer 16 is formed between the sacrificial silicon layer 15 and the dielectric layer 12. The initial interface layer 16 has high electronegativity and a high work function.

When the sacrificial silicon layer 15 is formed, the dielectric layer 12 is be exposed to the silicon source gas, the dopant gas and the reducing atmosphere 14. In other words, the sacrificial interface layer 13 and the initial interface layer 16 can prevent the dielectric layer 12 from being reduced.

Figure 2D:
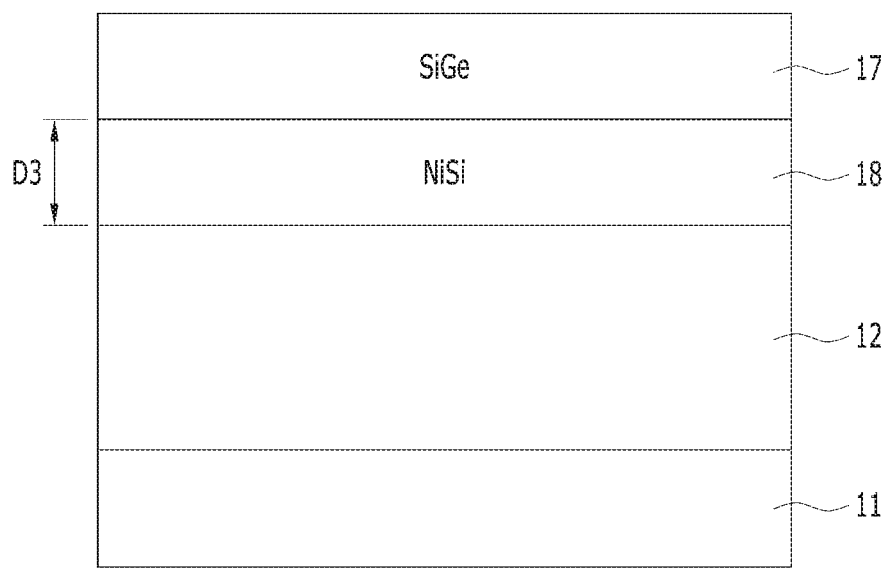

Referring to FIG. 2D, a second conductive layer 17 may then be formed on the sacrificial silicon layer 15. The second conductive layer 17 may be or include a silicon-containing material. For example, the second conductive layer 17 may be or include a silicon germanium (SiGe) layer or a boron-doped silicon germanium (SiGe) layer. The silicon germanium (SiGe) layer may be deposited using a silicon source gas and a germanium source gas. The boron-doped silicon germanium (SiGe) layer may be deposited using the silicon source gas, the germanium source gas and a boron-containing dopant gas. The silicon germanium (SiGe) layer may use a hydrogen-containing gas such as $H_2$ as a reaction gas. Each of the silicon source gas, the germanium source gas and the boron-containing dopant gas may contain hydrogen.

In an embodiment, the second conductive layer 17 may be deposited at a temperature of approximately 400° C. When the second conductive layer 17 is deposited at the temperature of approximately 400° C., the sacrificial silicon layer 15 and the initial interface layer 16 may react due to a thermal budget. For example, an the total amount of energy transferred to the sacrificial silicon layer 15 and the initial interface layer 16 at the elevated temperature (the thermal budget). An interface layer 18 may be formed through silicidation. The sacrificial silicon layer 15 and the initial interface layer 16 may be all consumed during the silicidation, thereby being completely converted into the interface layer 18. In other words, the interface layer 18 may be formed through full silicidation of the sacrificial silicon layer 15 and the initial interface layer 16. The interface layer 18 may be referred to as a fully-silicided interface layer (FUST IL).

The interface layer 18 may include a silicide whose electronegativity is high. For example, the interface layer 18 may include a nickel silicide, a cobalt silicide or a tungsten silicide.

Since the interface layer 18 includes a material whose electronegativity is high such as nickel, the interface layer 18 may have a high work function of approximately 4.9 eV or higher.

After the second conductive layer 17 is deposited, a thermal process may be further performed at a temperature of approximately 500° C. or lower if necessary. Hence, resistance of the interface layer 18 may decrease.

According to another embodiment of the present invention, the second conductive layer 17 may be formed by stacking a silicon layer and a silicon germanium layer. The silicon layer and the silicon germanium layer may be doped with a dopant, for example, boron. For example, a boron-doped silicon layer and a boron-doped silicon germanium layer may be stacked to form the second conductive layer 17.

As described above, a stack structure of the first conductive layer 11, the dielectric layer 12, the interface layer 18 and the second conductive layer 17 that are formed through a series of processes may become a capacitor. The first conductive layer 11 may be qualified as a bottom electrode of the capacitor or a storage node, and the second conductive layer 17 may be qualified as a top electrode of the capacitor or a plate. The interface layer 18 and the dielectric layer 12 may be in direct contact. The interface layer 18 and the second conductive layer 17 may be in direct contact. Since the second conductive layer 17 includes the silicon germanium layer, the top electrode of the capacitor may be formed of a non-metal material or a non-metal nitride.

Figure 3A:
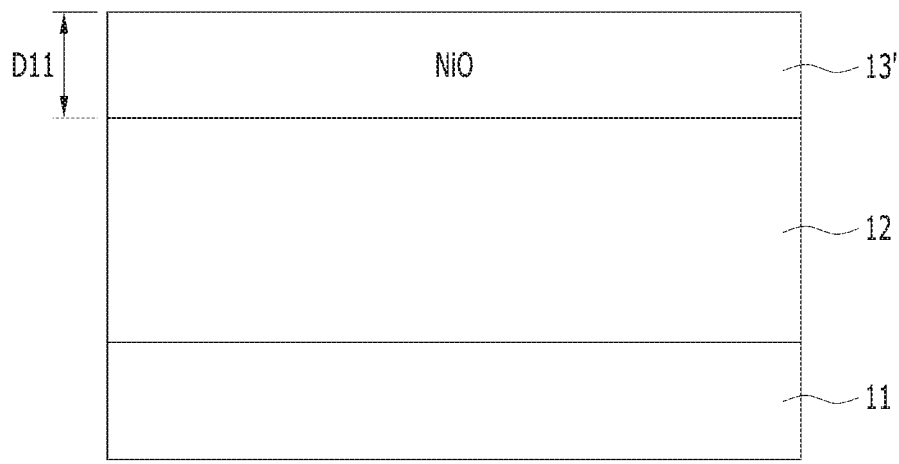
FIGS. 3A to 3C are cross-sectional views illustrating another example of a method for fabricating the semiconductor device in accordance with an embodiment of the present invention.
Figure 3B:
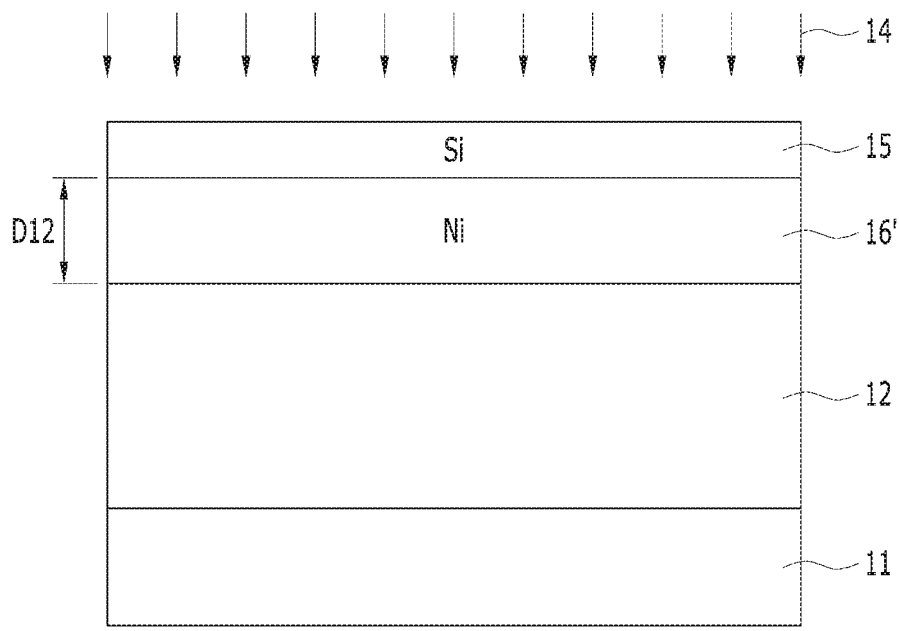
Figure 3C:
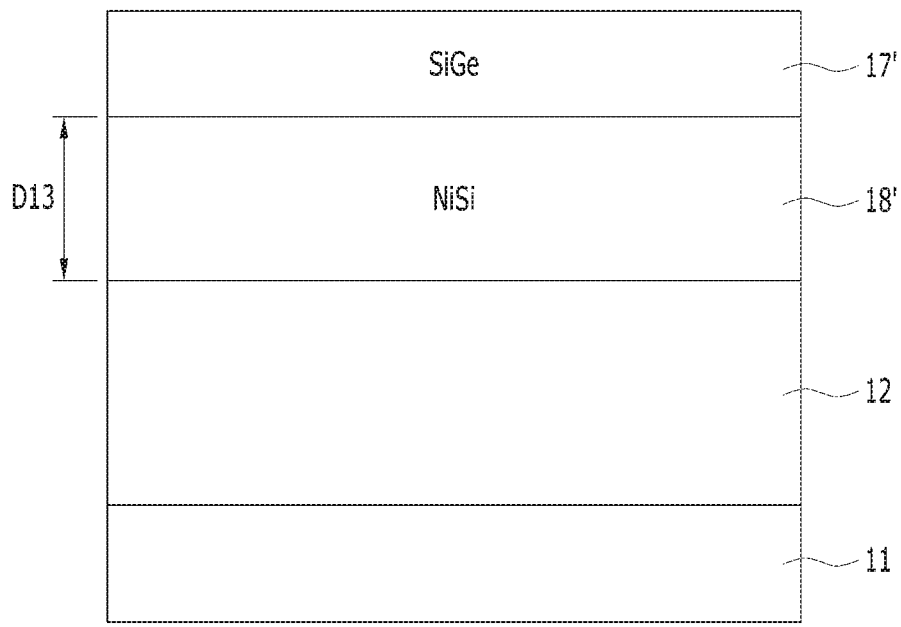

FIGS. 3A to 3C are cross-sectional views illustrating another example of a method for fabricating a semiconductor device in accordance with an embodiment of the present invention illustrated in FIG. 1A. Detailed descriptions of the processes which are identical to those described above with reference to FIGS. 2A to 2D are omitted.

Referring to FIG. 3A, a method for fabricating the semiconductor device in accordance with a modified example of an embodiment of the present invention may include forming a sacrificial interface layer 13' on a dielectric layer 12 after forming the dielectric layer 12 through the processes described above with reference to FIGS. 2A and 2B. The sacrificial interface layer 13' may include an oxide of an easily-reduced material. The sacrificial interface layer 13' may include an oxide whose electronegativity is high. The sacrificial interface layer 13' may include an easily-reduced oxide whose electronegativity is high.

For example in an embodiment, the sacrificial interface layer 13' may be made of or include an easily-reduced, high electronegativity oxide such as an oxide of nickel, i.e., a nickel oxide (NiO). According to another embodiment of the present invention, the sacrificial interface layer 13' may be made of or include a cobalt oxide or a tungsten oxide. The sacrificial interface layer 13' may have a fourth thickness D11.

The fourth thickness D11 of the sacrificial interface layer 13' shown in FIG. 3A may be larger than a first thickness D1 of the sacrificial interface layer 13 shown in FIG. 2B. The thickness of the sacrificial interface layer 13' may be approximately 2 nm or less.

Referring to FIG. 3B, a sacrificial silicon layer 15 may be formed under a hydrogen gas atmosphere 14. When the sacrificial silicon layer 15 is deposited, an initial interface layer 16' may be formed by a reduction of the sacrificial interface layer 13'. The initial interface layer 16' may be formed between the sacrificial silicon layer 15 and the dielectric layer 12 and may have a fifth thickness D12. The fifth thickness D12 of the initial interface layer 16' may be formed to be larger than a second thickness D2 of the initial interface layer 16 shown in FIG. 2C. The initial interface layer 16' may have the same thickness (D11=D12) as the sacrificial interface layer 13'.

Referring to FIG. 3C, a second conductive layer 17' may be formed on the sacrificial silicon layer 15. The second conductive layer 17' may be or include a silicon-containing material. The second conductive layer 17' may be or include a silicon germanium (SiGe) layer or a boron-doped silicon germanium (SiGe) layer. The silicon germanium (SiGe) layer may be deposited using a silicon source gas and a germanium source gas. The boron-doped silicon germanium (SiGe) layer may be deposited using the silicon source gas, the germanium source gas and a boron-containing dopant gas. The silicon germanium (Site) layer may use a hydrogen-containing gas such as $H_2$ as a reaction gas. Each of the silicon source gas, the germanium source gas and the boron-containing dopant gas may contain hydrogen.

The second conductive layer 17' may be deposited at a temperature of approximately 400° C. When the second conductive layer 17' is deposited at the temperature of approximately 400° C., the sacrificial silicon layer 15 and the initial interface layer 16' react due to the thermal budget. For example, an interface layer 18' may be formed through silicidation. The sacrificial silicon layer 15 and the initial interface layer 16' may be all consumed during the silicidation, thereby being completely converted into the interface layer 18'. In other words, the interface layer 18' may be formed through full silicidation of the sacrificial silicon layer 15 and the initial interface layer 16'. The interface layer 18' may have a sixth thickness D13.

The sixth thickness D13 of the interface layer 18' shown in FIG. 3C may be larger than a third thickness D3 of the interface layer 18 shown in FIG. 2D.

The interface layer 18' may be formed of a metal-rich metal silicide ($M_xSi_y$). The metal-rich metal silicide ($M_xSi_y$) may have a ratio of metal to silicon (x/y) greater than 1. The interface layer 18' may include a nickel-rich nickel silicide. For example, the nickel-rich nickel silicide may include a $Ni_2Si$ phase or a $Ni_3Si_2$ phase. The interface layer 18' may include a cobalt-rich cobalt silicide or a tungsten-rich tungsten silicide.

Since the interface layer 18' includes a material whose electronegativity is high such as nickel, the interface layer 18' may have a high work function of approximately 4.9 eV or higher. Besides, since the interface layer 18' includes the metal-rich metal silicide, the interface layer 18' may have a greatly higher work function. For example, a nickel silicide having the $Ni_2Si$ phase may have the work function ranging from approximately 4.9 eV to approximately 5.0 eV. The nickel silicide having the $Ni_2Si$ phase may have a higher work function than a nickel silicide having a NiSi phase.

As described above, the interface layer 18' may be formed of the metal-rich metal silicide having a large metal content. The metal content may be adjusted by increasing the thickness of the sacrificial interface layer 13' and increasing the amount of hydrogen gas implantation when the second conductive layer 17' is deposited.

A series of processes for forming the interface layer 18' may be represented by the following chemical formula:

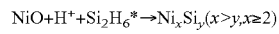

$$NiO+H^++Si_2H_6^* \rightarrow Ni_xSi_y (x>y, x\geq 2)$$

According to the embodiments described above, a leakage current may be improved without deterioration of the equivalent oxide layer thickness, and interface resistance may be also improved. In addition, the process cost may decrease while simplifying the process because a TiN process is not performed on the second conductive layers 17 and 17'.

As a comparative example, an upper portion of the dielectric layer 12 may be directly deposited with a titanium nitride (TIN). A TiN deposition process may be performed by using $TiCl_4$ and $NH_3$. Subsequently, a silicon germanium layer may be deposited on the TiN. A deposition process of the silicon germanium layer may be performed by using a gas such as $SiH_4$ and $GeH_4$.

$NH_3$, $SiH_4$ and $GeH_4$ used during such a SiGe/TiN stack deposition process may lead to a reduction of the dielectric layer 12 as strong reductants. Due to the reduction of the dielectric layer 12, the loss of oxygen may occur in the dielectric layer 12 and the quality of the layer may deteriorate.

According to an embodiment and the modified example of the present invention, since the sacrificial interface layers 13 and 13' which are easily reduced are formed on the dielectric layer 12, the reduction of the dielectric layer 12 may not occur although the dielectric layer 12 is exposed to a series of processes including a subsequent hydrogen gas. Accordingly, oxygen of the dielectric layer 12 may be prevented from being lost.

The use of the top electrode having a high work function to decrease the leakage current of the capacitor does not deteriorate the equivalent oxide layer thickness of the dielectric layer. TiN is widely known to those skilled in the art as the top electrode having high work function. The high work function of TIN is approximately 4.9 eV.

Recently, in order to decrease greatly the leakage current, a top electrode having a high work function of approximately 4.9 eV or higher has been required. It is known that such materials as Ru, Pt, etc. have a higher work function than TiN. However, since these noble metals are expensive and an etch process thereof is difficult, there is limitation in applying them to high integrated capacitors.

According to the present invention, as the interface layers 18 and 18' are formed by using materials whose electronegativity is high, the desired high work function of approximately 4.9 eV or higher can be obtained, thereby improving the leakage current of a capacitor without deterioration of the equivalent oxide layer thickness.

Figure 4A:
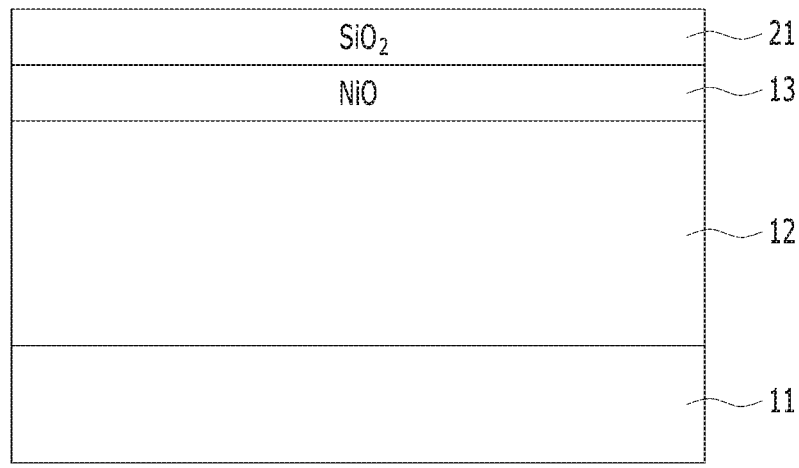
FIGS. 4A to 4C are cross-sectional views illustrating yet another example of a method for fabricating the semiconductor device in accordance with an embodiment of the present invention.
Figure 4B:
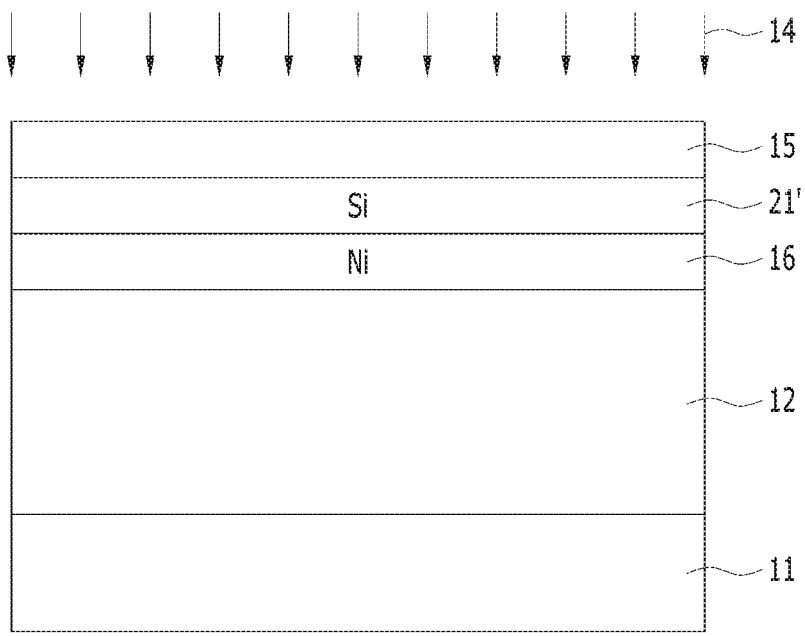
Figure 4C:
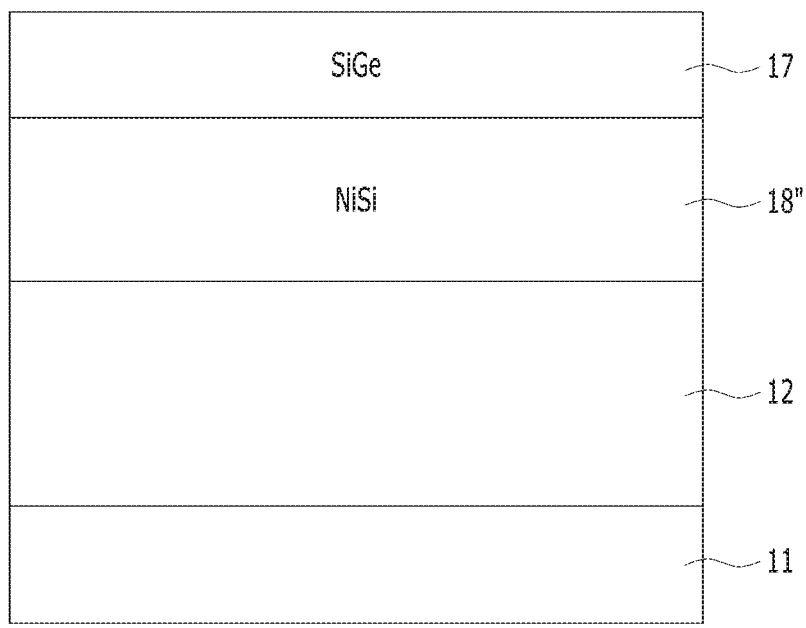

FIGS. 4A to 4C are cross-sectional views illustrating yet another example of method for fabricating the semiconductor device in accordance with an embodiment of the present invention. Detailed descriptions of the processes which overlap with those described above with reference to FIGS. 2A to 2D are omitted.

Referring to FIG. 4A, a method for fabricating the semiconductor device in accordance with an embodiment of the present invention may include forming a sacrificial interface layer 13 on a dielectric layer 12 after forming the dielectric layer 12 through the processes described above with reference to FIGS. 2A and 2B. The sacrificial interface layer 13 may be made of or include a nickel oxide (NiO). According to another embodiment of the present invention, the sacrificial interface layer 13 may be made of or include a cobalt oxide or a tungsten oxide. The sacrificial interface layer 13 may be formed by an Atomic Layer Deposition (ALD) or any other suitable method.

Subsequently, an auxiliary sacrificial interface layer 21 may be formed on the sacrificial interface layer 13. The auxiliary sacrificial interface layer 21 may be formed, for example, by the ALD. The auxiliary sacrificial interface layer 21 may be or include a silicon-containing material. The auxiliary sacrificial interface layer 21 may include a silicon oxide ($SiO_2$).

The sacrificial interface layer 13 and the auxiliary sacrificial interface layer 21 may be formed, for example, by the ALD. The sacrificial interface layer 13 and the auxiliary sacrificial interface layer 21 may be formed in a bi-layer structure. For example, the sacrificial interface layer 13 and the auxiliary sacrificial interface layer 21 may be formed in the bi-layer structure of $SiO_2$/NiO.

According to another embodiment of the present invention, the sacrificial interface layer 13 and the auxiliary sacrificial interface layer 21 may be formed in a laminate structure. For example, the laminate structure may include alternating layers of the sacrificial interface layer 13 and the auxiliary sacrificial interface layer 21.

Figure 5:
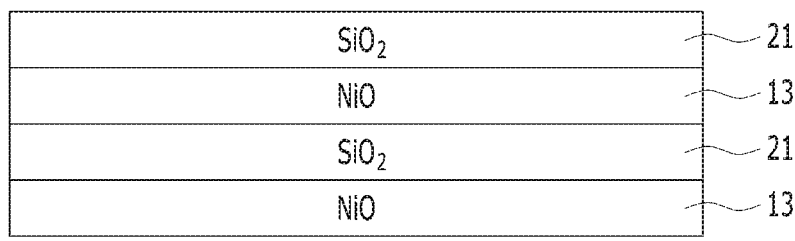
FIG. 5 is a cross-sectional view illustrating a laminate structure of a nickel oxide and a silicon oxide.

FIG. 5 is a cross-sectional view illustrating a laminate structure of a nickel oxide and a silicon oxide.

Referring to FIG. 5, the nickel oxide and the silicon oxide may be alternately deposited to form the laminate structure such as $SiO_2$/NiO/$SiO_2$/NiO. Each of the nickel oxide and the silicon oxide may be alternately deposited at least twice.

Total thickness of the sacrificial interface layer 13 and the auxiliary sacrificial interface layer 21 may be 2 nm or less.

Referring to FIG. 4B, the sacrificial interface layer 13 and the auxiliary sacrificial interface layer 21 may be exposed to a reducing atmosphere 14. When the sacrificial interface layer 13 and the auxiliary sacrificial interface layer 21 are exposed to the reducing atmosphere 14, the sacrificial interface layer 13 and the auxiliary sacrificial interface layer 21 may be reduced. An initial interface layer 16 may be formed by such a reduction of the sacrificial interface layer 13. Besides, an auxiliary initial interface layer 21' may be formed by such a reduction of the auxiliary sacrificial interface layer 21.

According to an embodiment of the present invention, a deposition process of a sacrificial silicon layer 15 may be performed to form the initial interface layer 16. The deposition process of the sacrificial silicon layer 15 may be performed under the reducing atmosphere 14 including a hydrogen gas.

The sacrificial silicon layer 15 may be deposited under the reducing atmosphere 14 including a large amount of the hydrogen gas. Since hydrogen has great reducing power, the sacrificial interface layer 13 and the auxiliary sacrificial interface layer 21 may be reduced when the sacrificial silicon layer 15 is deposited. A material remaining due to the reduction of the sacrificial interface layer 13 is qualified as the initial interface layer 16 for short. When the sacrificial interface layer 13 is formed of a metal oxide, the metal oxide may be reduced to a metal by hydrogen. For example, when the sacrificial interface layer 13 is formed, for example, a nickel oxide (NiO), nickel (Ni) may be formed by a reduction of the nickel oxide (NiO). The initial interface layer 16 may have high electronegativity. When the sacrificial silicon layer 15 is formed under the reducing atmosphere 14, the sacrificial silicon layer 15 may be deposited at a low temperature. A material remaining due to the reduction of the auxiliary sacrificial interface layer 21 is qualified as the auxiliary initial interface layer 21' for short. When the auxiliary sacrificial interface layer 21 is formed of a silicon oxide, the silicon oxide may be converted into silicon by hydrogen. For example, the auxiliary initial interface layer 21' may be a silicon layer.

The sacrificial silicon layer 15 may be or include a doped silicon layer. The sacrificial silicon layer 15 may be a silicon layer doped with boron. The sacrificial silicon layer 15 may be formed, for example, CVD or any other suitable method. The sacrificial silicon layer 15 may be deposited using a hydrogen-containing silicon source gas under the reducing atmosphere 14 including the hydrogen gas. According to another embodiment of the present invention, the sacrificial silicon layer 15 may be deposited using the hydrogen-containing silicon source gas and a hydrogen-containing dopant gas under the reducing atmosphere 14 including the hydrogen gas. The hydrogen-containing silicon source gas may include silane ($SiH_4$) or disilane ($Si_2H_6$). The hydrogen-containing dopant gas may include boron, borane ($BH_3$), diborane ($B_2H_6$) or any combinations thereof. In this manner, the hydrogen-containing silicon source gas and the hydrogen-containing dopant gas, which are compounds containing hydrogen, may promote the reduction of the sacrificial interface layer 13.

As described above, when the sacrificial silicon layer 15 is formed, the sacrificial interface layer 13 may be reduced so that the initial interface layer 16 may be formed between the sacrificial silicon layer 15 and the dielectric layer 12. The initial interface layer 16 has high electronegativity and high work function.

When the sacrificial silicon layer 15 is formed, the dielectric layer 12 is not exposed to the hydrogen-containing silicon source gas, the hydrogen-containing dopant gas and the reducing atmosphere 14. In other words, the sacrificial interface layer 13 and the initial interface layer 16 prevent the dielectric layer 12 from being reduced.

Referring to FIG. 4C, a second conductive layer 17 may be formed on the sacrificial silicon layer 15. The second conductive layer 17 may be made of or include a silicon-containing material. The second conductive layer 17 may be made of or include a silicon germanium (SiGe) layer or a boron-doped silicon germanium (SiGe) layer. The silicon germanium (SiGe) layer may be deposited using a silicon source gas and a germanium source gas. The boron-doped silicon germanium (SiGe) layer may be deposited using the silicon source gas, the germanium source gas and a boron-containing dopant gas. The silicon germanium (SiGe) layer may use a hydrogen-containing gas such as $H_2$ as a reaction gas. Each of the silicon source gas, the germanium source gas and the boron-containing dopant gas may contain hydrogen.

The second conductive layer 17 may be deposited at a temperature of approximately 400° C. When the second conductive layer 17 is deposited at the temperature of approximately 400° C., the sacrificial silicon layer 15, the auxiliary initial interface layer 21' and the initial interface layer 16 react due to the thermal budget. For example, an interface layer 18" may be formed through silicidation. The sacrificial silicon layer 15, the auxiliary initial interface layer 21' and the initial interface layer 16 may be all consumed during the silicidation, thereby being completely converted into the interface layer 18". In other words, the interface layer 18" may be formed through fully silicidation of the sacrificial silicon layer 15, the auxiliary initial interface layer 21' and the initial interface layer 16. The interface layer 18" may be referred to as a fully-silicided interface layer (FUSI IL).

The interface layer 18" may include a silicide whose electronegativity is high. For example, the interface layer 18" may include a nickel silicide, a cobalt silicide or a tungsten silicide.

Since the interface layer 18" includes a material whose electronegativity is high such as nickel, the interface layer 18" may have a high work function. The interface layer 18" may have the high work function of approximately 4.9 eV or higher.

As described above, the interface layer 18" may be formed through the silicidation of the sacrificial silicon layer 15, the auxiliary initial interface layer 21' and the initial interface layer 16. As the auxiliary initial interface layer 21' is additionally formed, the interface layer 18" may be easily controlled to be formed.

After the second conductive layer 17 is deposited, a thermal process may be further performed at a temperature of approximately 500° C. or lower if necessary. Hence, resistance of the interface layer 18" may decrease.

According to another embodiment of the present invention, the second conductive layer 17 may be formed by stacking a silicon layer and a silicon germanium layer. The silicon layer and the silicon germanium layer may be doped with a dopant, for example, boron. For example, a boron-doped silicon layer and a boron-doped silicon germanium layer may be stacked to form the second conductive layer 17.

As described above, a stack structure of a first conductive layer 11, the dielectric layer 12, the interface layer 18" and the second conductive layer 17 that are formed through a series of processes may become a capacitor.

Figure 6A:
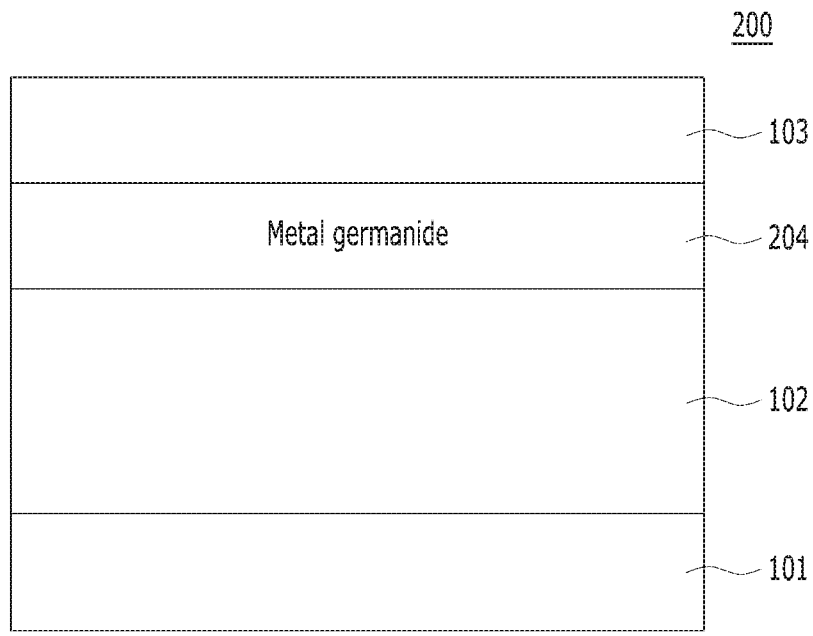
FIG. 6A is a cross-sectional view of a semiconductor device in accordance with an embodiment of the present invention.

FIG. 6A is a cross-sectional view of a semiconductor device 200 in accordance with an embodiment of the present invention. Detailed descriptions of the components and configurations of the semiconductor device which overlap with those shown as above with reference to FIG. 1A are omitted.

Referring to FIG. 6A, the semiconductor device 200 may include a first conductive layer 101, a dielectric layer 102, and a second conductive layer 103. An interface layer 204 may be formed between the dielectric layer 102 and the second conductive layer 103.

The interface layer 204 may include a conductive material. The interface layer 204 may be or include a high work function material. The interface layer 204 may be or include the high work function material of approximately 4.9 eV or higher. The interface layer 204 may be or include a germanide material whose electronegativity is high. The interface layer 204 may be or include a metal germanide. The interface layer 204 may be or include a nickel germanide, a cobalt germanide or a tungsten germanide. The nickel germanide may have a high work function of approximately 5.2 eV.

Figure 6B:
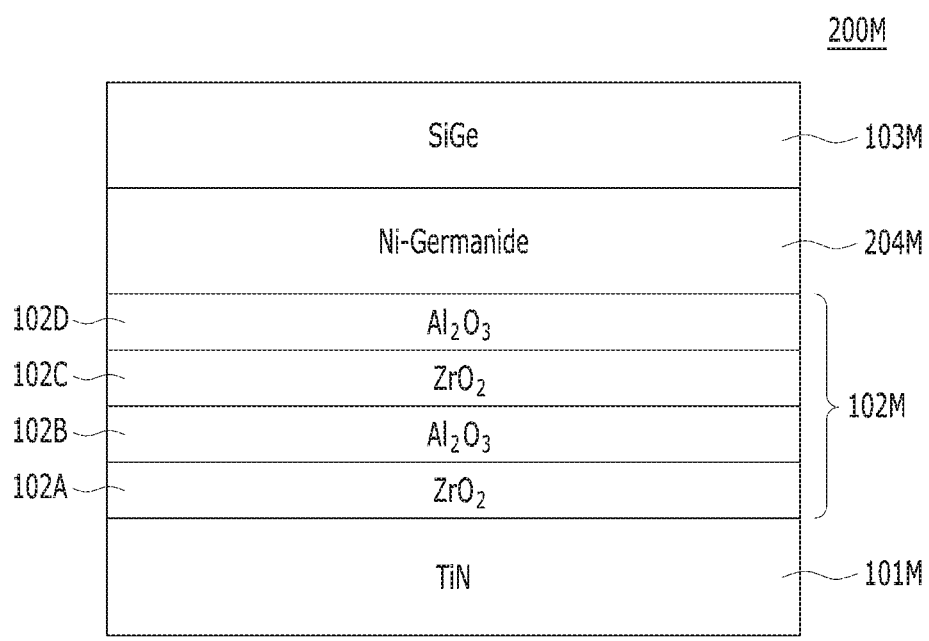
FIG. 6B is a cross-sectional view of a capacitor as an application example of the semiconductor device in accordance with an embodiment of the present invention.

FIG. 6B is a cross-sectional view of a capacitor as an application example of the semiconductor device in accordance with an embodiment of the present invention.

Referring to FIG. 6B, a capacitor 200M may include a bottom electrode 101M, a dielectric layer 102M, an interface layer 204M, and a top electrode 103M.

The bottom electrode 101M may be formed of a metal nitride. The bottom electrode 101M may be formed, for example, of a titanium nitride (TiN).

The top electrode 103M may be formed, for example, of a silicon germanium (SiGe) layer. The silicon germanium layer may be doped with a dopant, for example, boron.

The dielectric layer 102M may have a ZAZ ($ZrO_2/Al_2O_3/ZrO_2$) stack structure. The dielectric layer 102M may include a first zirconium oxide 102A, an aluminum oxide 102B and a second zirconium oxide 102C which are sequentially stacked. The dielectric layer 102M may further include an aluminum oxide 102D formed on the second zirconium oxide 102C. This structure is referred to as a ZAZA stack structure.

The interface layer 204M may be formed, for example, a nickel germanide (Ni-Germanide).

Figure 7A:
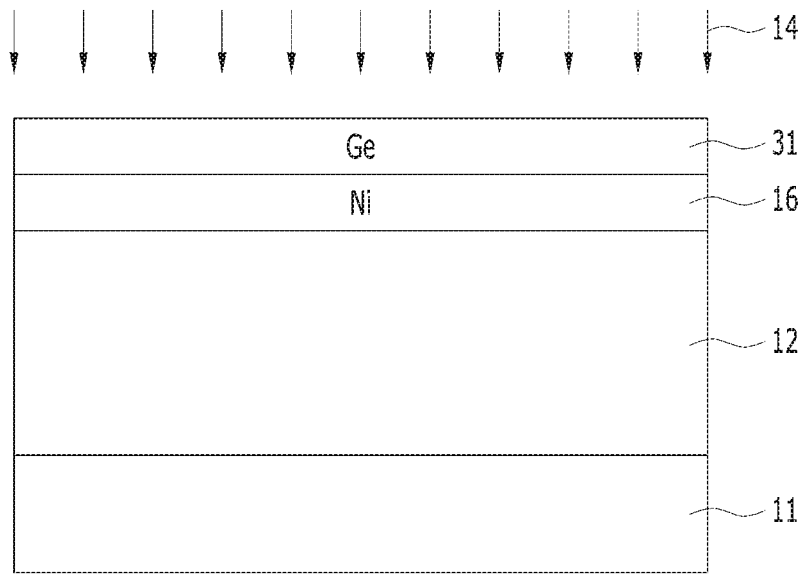
FIGS. 7A and 7B are cross-sectional views illustrating an example of a method for fabricating the semiconductor device in accordance with an embodiment of the present invention.
Figure 7B:
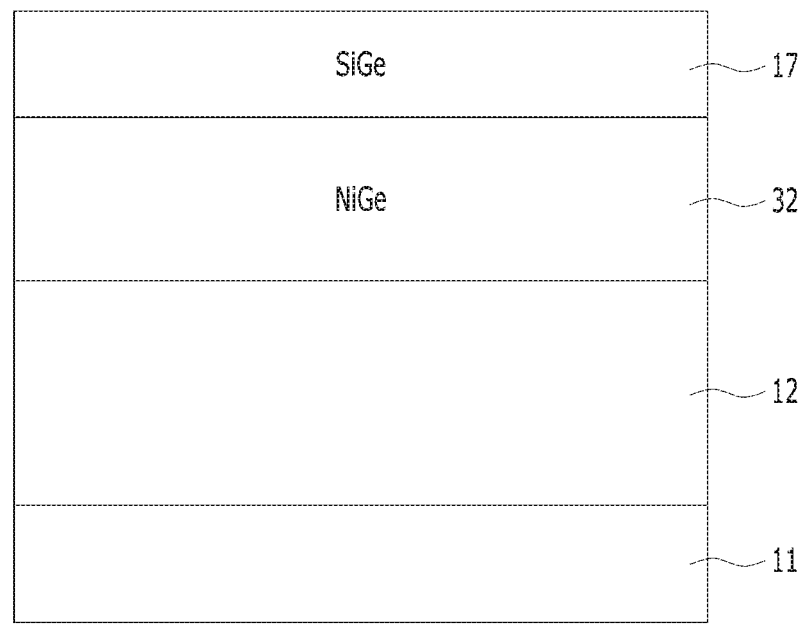

FIGS. 7A and 7B are cross-sectional views illustrating an example of a method for fabricating the semiconductor device in accordance with the second embodiment of the present invention. Detailed descriptions of the processes which overlap with those shown above with reference to FIGS. 2A to 2D are omitted.

The method for fabricating the semiconductor device in accordance with an embodiment of the present invention may include forming a sacrificial interface layer 13 on a dielectric layer 12 after forming the dielectric layer 12 through the processes described above with reference to FIGS. 2A and 2B. The sacrificial interface layer 13 may be made of or include a nickel oxide (NiO). According to another embodiment of the present invention, the sacrificial interface layer 13 may be made of or include a cobalt oxide or a tungsten oxide. The sacrificial interface layer 13 may be formed by an Atomic Layer Deposition (ALD) or any other suitable method.

Referring now to FIG. 7A, after the sacrificial interface layer 13 is formed, the sacrificial interface layer 13 may be exposed to a reducing atmosphere 14. When the sacrificial interface layer 13 is exposed to the reducing atmosphere 14, the sacrificial interface layer 13 may be reduced. An initial interface layer 16 may be formed by such a reduction of the sacrificial interface layer 13.

According to the illustrated embodiment of the present invention, a deposition process of a sacrificial germanium layer 31 may be performed to form the initial interface layer 16. The deposition process of the sacrificial germanium layer 31 may be performed under a reducing atmosphere 14 including a hydrogen gas.

Since hydrogen has great reducing power, the sacrificial interface layer 13 may be reduced when the sacrificial germanium layer 31 is deposited. A material remaining due to the reduction of the sacrificial interface layer 13 is qualified as the initial interface layer 16 for short. When the sacrificial interface layer 13 is formed of a metal oxide, the metal oxide may be reduced to a metal by hydrogen. For example, when the sacrificial interface layer 13 is formed, for example, of a nickel oxide (NiO), nickel (Ni) may be formed by a reduction of the nickel oxide (NiO). The initial interface layer 16 may have high electronegativity. When the sacrificial germanium layer 31 is formed under the reducing atmosphere 14 including a great amount of the hydrogen gas, the sacrificial germanium layer 31 may be deposited at a low temperature.

The sacrificial germanium layer 31 may have a doped germanium layer. The sacrificial germanium layer 31 may be a germanium layer doped with boron. The sacrificial germanium layer 31 may be formed, for example, by Chemical Vapor Deposition (CVD) or any other suitable method. The sacrificial germanium layer 31 may be deposited using a hydrogen-containing germanium source gas under the reducing atmosphere 14 including the hydrogen gas. According to another embodiment of the present invention, the sacrificial germanium layer 31 may be deposited using the hydrogen-containing germanium source gas and a hydrogen-containing dopant gas under the reducing atmosphere 14 including the hydrogen gas. In an embodiment, a compound gas containing hydrogen such as $GeH_4$ may be used as the hydrogen-containing germanium source gas. The hydrogen-containing dopant gas may include boron, borane ($BH_3$), diborane ($B_2H_6$) or any combinations thereof. In this manner, the hydrogen-containing germanium source gas and the hydrogen-containing dopant gas, which are as compounds containing hydrogen, may promote the reduction of the sacrificial interface layer 13.

As described above, when the sacrificial germanium layer 31 is formed, the sacrificial interface layer 13 may be reduced so that the initial interface layer 16 may be formed between the sacrificial germanium layer 31 and the dielectric layer 12. The initial interface layer 16 has high electronegativity and high work function.

When the sacrificial germanium layer 31 is formed, the dielectric layer 12 is not exposed to the hydrogen-containing germanium source gas, the hydrogen-containing dopant gas and the reducing atmosphere 14. In other words, the sacrificial interface layer 13 and the initial interface layer 16 prevent the dielectric layer 12 from being reduced.

Referring to FIG. 7B, a second conductive layer 17 may be formed on the sacrificial germanium layer 31. The second conductive layer 17 may be or include a silicon-containing material. The second conductive layer 17 may be or include a silicon germanium (SiGe) layer or a boron-doped silicon germanium (SiGe) layer. The silicon germanium (SiGe) layer may be deposited using a silicon source gas and a germanium source gas. The boron-doped silicon germanium (SiGe) layer may be deposited using the silicon source gas, the germanium source gas and a boron-containing dopant gas. The silicon germanium (SiGe) layer may use a hydrogen-containing gas such as $H_2$ as a reaction gas. Each of the silicon source gas, the germanium source gas and the boron-containing dopant gas may contain hydrogen.

The second conductive layer 17 may be deposited at a temperature of approximately 400° C. When the second conductive layer 17 is deposited at the temperature of approximately 400° C., the sacrificial germanium layer 31 and the initial interface layer 16 react due to the thermal budget. For example, an interface layer 32 may be formed through a germanide reaction. The sacrificial germanium layer 31 and the initial interface layer 16 may be all consumed during the germanide reaction, thereby being completely converted into the interface layer 32. In other words, the interface layer 32 may be formed through full-germanide reaction of the sacrificial germanium layer 31 and the initial interface layer 16. The interface layer 32 may be referred to as a fully-germanide interface layer (FUGE IL). The interface layer 32 may be or include a metal germanide.

The interface layer 32 may be or include a germanide whose electronegativity is high. For example, the interface layer 32 may be or include a nickel germanide, a cobalt germanide or a tungsten germanide.

Since the interface layer 32 includes a material whose electronegativity is high such as nickel, the interface layer 32 may have a high work function of approximately 4.9 eV or higher. For example, a nickel germanide (NiGe) may have a high work function of approximately 5.2 eV. The nickel germanide (NiGe) may have a higher work function than the nickel silicide.

After the second conductive layer 17 is deposited, a thermal process may be further performed at a temperature of approximately 500° C. or lower if necessary. Hence, resistance of the interface layer 32 may decrease.

According to another embodiment of the present invention, the second conductive layer 17 may be formed by stacking a silicon layer and a silicon germanium layer. The silicon layer and the silicon germanium layer may be doped with a dopant, for example, boron. For example, a boron-doped silicon (Si) layer and a boron-doped silicon germanium (SiGe) layer may be stacked to form the second conductive layer 17.

As described above, a stack structure of a first conductive layer 11, the dielectric layer 12, the interface layer 32 and the second conductive layer 17 that are formed through a series of processes may become a capacitor.

Figure 8A:
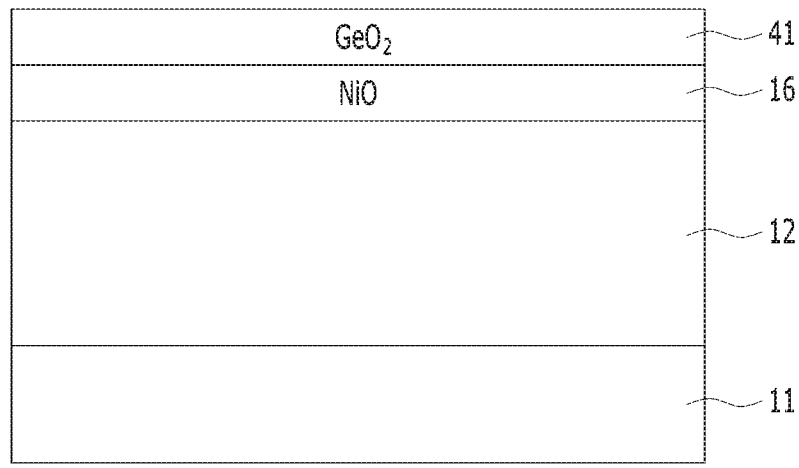
FIGS. 8A to 8C are cross-sectional views illustrating another example of a method for fabricating the semiconductor device in accordance with an embodiment of the present invention.
Figure 8B:
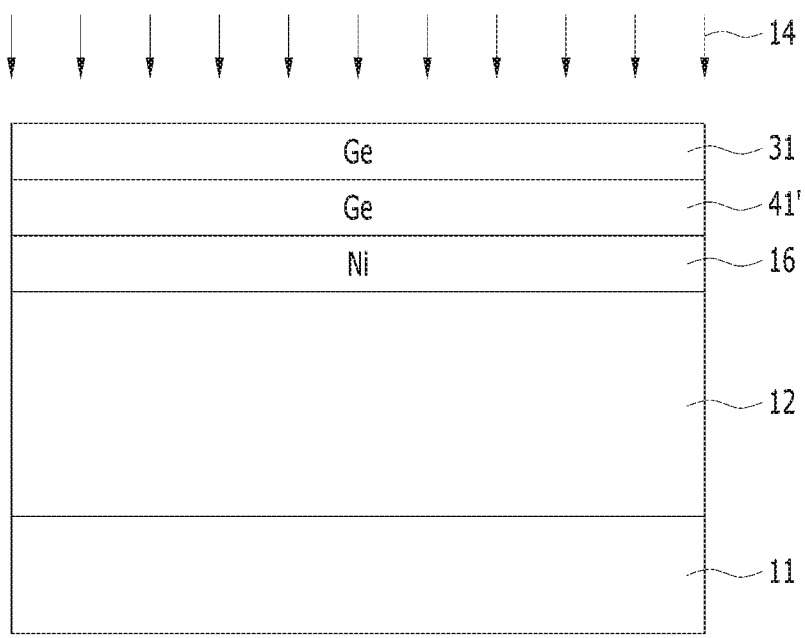
Figure 8C:
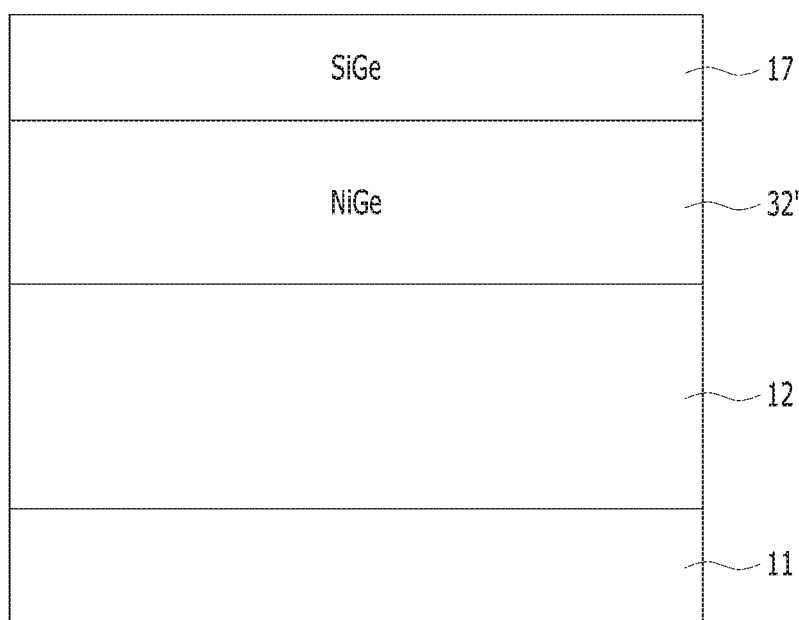

FIGS. 8A to 8C are cross-sectional views illustrating another example of the method for fabricating the semiconductor device in accordance with an embodiment of the present invention.

The method for fabricating the semiconductor device in accordance with an embodiment of the present invention may include forming a sacrificial interface layer 13 on a dielectric layer 12 after forming the dielectric layer 12 through the processes described above with reference to FIGS. 2A and 2B. The sacrificial interface layer 13 may be made of or include a nickel oxide (NiO). According to another embodiment of the present invention, the sacrificial interface layer 13 may be made of or include a cobalt oxide or a tungsten oxide. The sacrificial interface layer 13 may be formed by an Atomic Layer Deposition (ALD) or any other suitable method.

Subsequently, referring to FIG. 8A, an auxiliary sacrificial interface layer 41 may be formed on the sacrificial interface layer 13. The auxiliary sacrificial interface layer 41 may be formed, for example, by ALD or any other suitable method. The auxiliary sacrificial interface layer 41 may include a germanium-containing material. The auxiliary sacrificial interface layer 41 may include a germanium oxide ($GeO_2$).

The sacrificial interface layer 13 and the auxiliary sacrificial interface layer 41 may be formed, for example, by ALD. The sacrificial interface layer 13 and the auxiliary sacrificial interface layer 41 may be formed in a bi-layer structure. For example, the sacrificial interface layer 13 and the auxiliary sacrificial interface layer 41 may be formed in the bi-layer structure of $GeO_2/NiO$.

According to another embodiment of the present invention, the sacrificial interface layer 13 and the auxiliary sacrificial interface layer 41 may be formed in a laminate structure.

Figure 9:
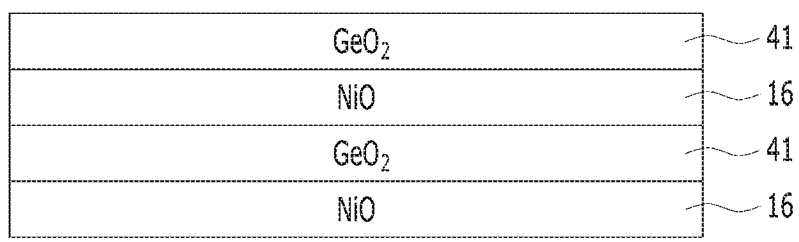
FIG. 9 is a cross-sectional view illustrating a laminate structure of a nickel oxide and a germanium oxide.

FIG. 9 is a cross-sectional view illustrating a laminate structure of a nickel oxide and a germanium oxide.

Referring to FIG. 9, the nickel oxide and the germanium oxide may be alternately deposited to form the laminate structure such as $GeO_2/NiO/GeO_2/NiO$. Each of the nickel oxide and the germanium oxide may be alternately deposited at least twice.

Total thickness of the sacrificial interface layer 13 and the auxiliary sacrificial interface layer 41 may be 2 nm or less.

Referring to FIG. 8B, the sacrificial interface layer 13 and the auxiliary sacrificial interface layer 41 may be exposed to the reducing atmosphere 14. When the sacrificial interface layer 13 and the auxiliary sacrificial interface layer 41 are exposed to the reducing atmosphere 14, the sacrificial interface layer 13 and the auxiliary sacrificial interface layer 41 may be reduced. An initial interface layer 16 may be formed by such a reduction of the sacrificial interface layer 13. Besides, an auxiliary initial interface layer 41' may be formed by such a reduction of the auxiliary sacrificial interface layer 41.

According to an embodiment of the present invention, a deposition process of a sacrificial germanium layer 31 may be performed to form the initial interface layer 16. The deposition process of the sacrificial germanium layer 31 may be performed under the reducing atmosphere 14 including a hydrogen gas.

The sacrificial germanium layer 31 may be deposited under the reducing atmosphere 14 including a large amount of the hydrogen gas. Since hydrogen has great reducing power, the sacrificial interface layer 13 and the auxiliary sacrificial interface layer 41 may be reduced when the sacrificial germanium layer 31 is deposited. A material remaining due to the reduction of the sacrificial interface layer 13 is qualified as the initial interface layer 16 for short. When the sacrificial interface layer 13 is formed of a metal oxide, the metal oxide may be reduced to a metal by hydrogen. For example, when the sacrificial interface layer 13 is formed, for example, a nickel oxide (NiO), nickel (Ni) may be formed by a reduction of the nickel oxide (NiO). The initial interface layer 16 may have high electronegativity. When the sacrificial germanium layer 31 is formed under the reducing atmosphere 14, the sacrificial germanium layer 31 may be deposited at a low temperature. A material remaining due to the reduction of the auxiliary sacrificial interface layer 41 is qualified as the auxiliary initial interface layer 41' for short. When the auxiliary sacrificial interface layer 41 is formed of a germanium oxide, the germanium oxide may be converted into germanium by hydrogen. For example, the auxiliary initial interface layer 41' may be a germanium layer.

The sacrificial germanium layer 31 may include a doped germanium layer. The sacrificial germanium layer 31 may be a germanium layer doped with boron. The sacrificial germanium layer 31 may be formed, for example, by Chemical Vapor Deposition (CVD) or any other suitable method. The sacrificial germanium layer 31 may be formed using a hydrogen-containing germanium source gas and a hydrogen-containing dopant gas. The hydrogen-containing germanium source gas may include $GeH_4$. The hydrogen-containing dopant gas may include borane ($BH_3$), diborane ($B_2H_6$) or any combinations thereof. In this manner, the hydrogen-containing germanium source gas and the hydrogen-containing dopant gas, which are as compounds containing hydrogen, may promote the reduction of the sacrificial interface layer 13.

As described above, when the sacrificial germanium layer 31 is formed, the sacrificial interface layer 13 may be reduced so that the initial interface layer 16 may be formed between the sacrificial germanium layer 31 and the dielectric layer 12. The initial interface layer 16 has high electronegativity and high work function.

When the sacrificial germanium layer 31 is formed, the dielectric layer 12 is not exposed to the hydrogen-containing germanium source gas, the hydrogen-containing dopant gas and the reducing atmosphere 14. In other words, the sacrificial interface layer 13 and the initial interface layer 16 prevent the dielectric layer 12 from being reduced.

Referring to FIG. 8C, a second conductive layer 17 may be formed on the sacrificial germanium layer 31. The second conductive layer 17 may be or include a silicon-containing material. The second conductive layer 17 may be or include a silicon germanium (SiGe) layer or a boron-doped silicon germanium (SiGe) layer. The silicon germanium (SiGe) layer may be deposited using a silicon source gas and a germanium source gas. The boron-doped silicon germanium (SiGe) layer may be deposited using the silicon source gas, the germanium source gas and a boron source gas. The silicon germanium (SiGe) layer may use a hydrogen-containing gas such as $H_2$ as a reaction gas.

The second conductive layer 17 may be deposited at an elevated temperature, for example a temperature of approximately 400° C. When the second conductive layer 17 is deposited at the temperature of approximately 400° C., the sacrificial germanium layer 31, the auxiliary initial interface layer 41' and the initial interface layer 16 react due to the thermal budget. For example, an interface layer 32' may be formed through a germanide reaction. The sacrificial germanium layer 31, the auxiliary initial interface layer 41' and the initial interface layer 16 may be all consumed during the germanide reaction, thereby being completely converted into the interface layer 32'. In other words, the interface layer 32' may be formed through a fully-germanide reaction of the sacrificial germanium layer 31, the auxiliary initial interface layer 41' and the initial interface layer 16. The interface layer 32' may be referred to as a fully-germanide interface layer (FUGE IL).

The interface layer 32' may be or include a germanide of a material whose electronegativity is high. For example, the interface layer 32' may be or include a nickel germanide, a cobalt germanide or a tungsten germanide.

Since the interface layer 32' includes a material whose electronegativity is high such as nickel, the interface layer 32' may have a high work function. The interface layer 32' may have the high work function of approximately 4.9 eV or higher. For example, a nickel germanide (NiGe) may have a high work function of approximately 5.2 eV. The nickel germanide (NiGe) may have a higher work function than the nickel silicide.

After the second conductive layer 17 is deposited, a thermal process may be further performed at a temperature of approximately 500° C. or lower if necessary. Hence, resistance of the interface layer 32' may decrease.

According to another embodiment of the present invention, the second conductive layer 17 may be formed by sequentially stacking a silicon layer and a silicon germanium layer. The silicon layer and the silicon germanium layer may be doped with a dopant, for example, boron. For example, a boron-doped silicon (Si) layer and a boron-doped silicon germanium (Site) layer may be stacked to form the second conductive layer 17.

As described above, a stack structure of a first conductive layer 11, the dielectric layer 12, the interface layer 32' and the second conductive layer 17 that are formed through a series of processes may become a capacitor.

FIGS. 10A to 10E are cross-sectional views illustrating a method for fabricating a DRAM capacitor in accordance with embodiments of the present invention. A sacrificial interface layer, a sacrificial layer, an initial interface layer, an interface layer, etc. shown in FIGS. 10A to 10E refer to the aforementioned embodiments of the present invention.

Figure 10A:
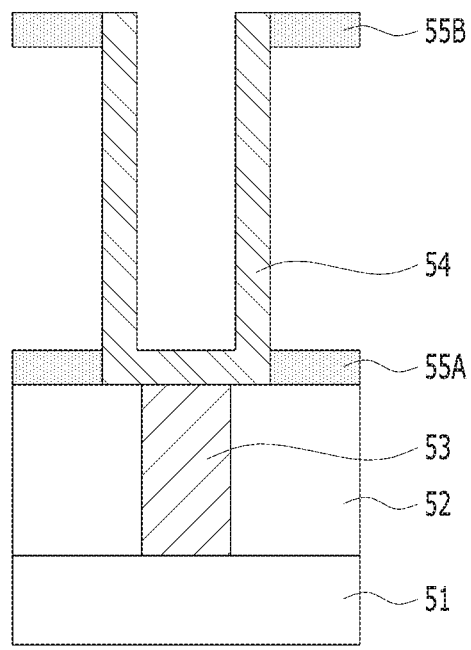
FIGS. 10A to 10E are cross-sectional views illustrating a method for fabricating a DRAM capacitor in accordance with embodiments of the present invention.

Referring to FIG. 10A, an inter-layer dielectric layer 52 may be formed on a semiconductor substrate 51. A storage node contact plug 53 coupled to a portion of the semiconductor substrate 51 may be formed to penetrate through the inter-layer dielectric layer 52. The storage node contact plug 53 may be formed of any suitable material including a polysilicon, a metal, a metal nitride, or combinations thereof. Although not illustrated, a cell transistor and a bit line may be further formed before the inter-layer dielectric layer 52 is formed. The cell transistor may include a buried word line structure.

A bottom electrode 54 may be formed on the storage node contact plug 53. The bottom electrode 54 may, for example, have a cylindrical shape. According to another embodiment of the present invention, the bottom electrode 54 may have a pillar shape. In an embodiment, the bottom electrode 54 may be formed of a metal nitride, such as, for example, a titanium nitride.

The bottom electrode 54 may be supported by first and second supporters 55A and 55B. The first supporter 55A may be coupled to a bottom portion of the bottom electrode 54. The second supporter 55B may be coupled to a top portion of the bottom electrode 54. The first and second supporters 55A and 55B may include a silicon nitride, a silicon carbide, or a combination thereof. The first supporter 55A may also be an etch stop layer.

Figure 10B:
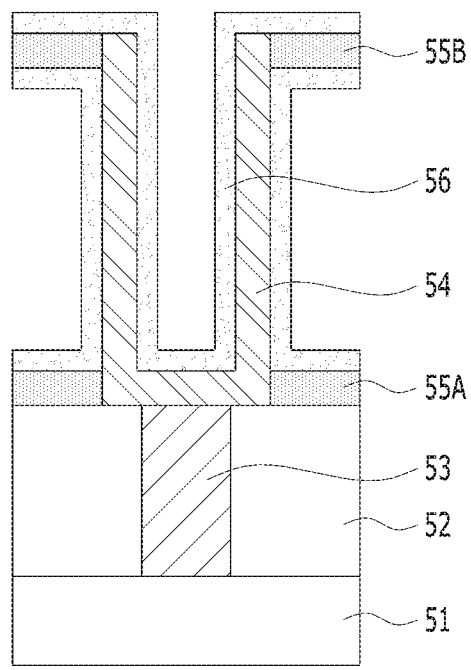

Referring to FIG. 10B, a dielectric layer 56 may be formed. The dielectric layer 56 may have a ZAZA stack structure. The dielectric layer 56 may cover the bottom electrode 54 and the first and second supporters 55A and 55B.

Figure 10C:
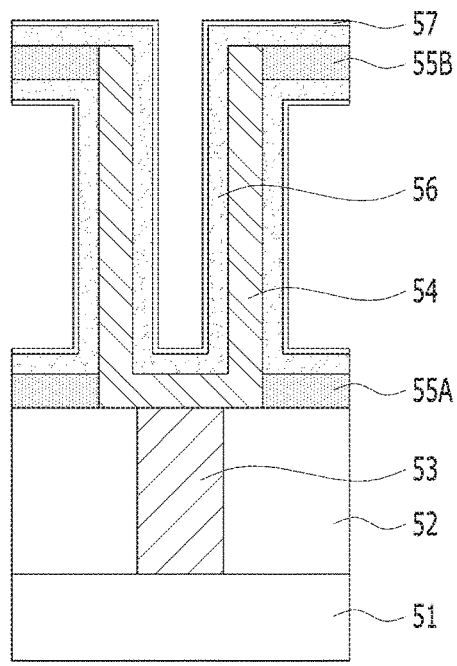

Referring to FIG. 10C, a sacrificial interface layer 57 may be formed on the dielectric layer 56. The sacrificial interface layer 57 may be formed, for example, a nickel oxide. According to another embodiment of the present invention, the sacrificial interface layer 57 may be formed of a cobalt oxide or a tungsten oxide.

Figure 10D:
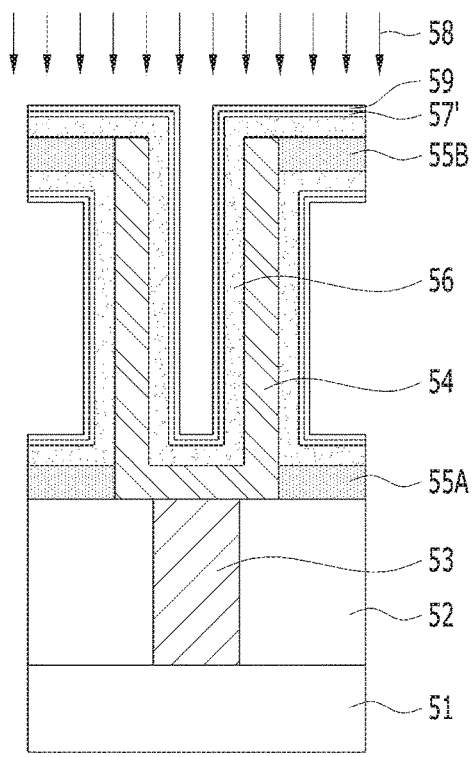

Referring to FIG. 10D, a sacrificial layer 59 may be formed at a reducing atmosphere 58. The reducing atmosphere 58 may contain a hydrogen gas. The sacrificial layer 59 may include a silicon layer or a germanium layer. In an embodiment, the sacrificial layer 59 may be deposited using a compound gas containing hydrogen.

As the sacrificial layer 59 is formed under the reducing atmosphere 58, an initial interface layer 57' may be formed by such a reduction of the sacrificial interface layer 57. For example, the sacrificial interface layer 57 may be or include a nickel oxide, and the initial interface layer 57' may be or include nickel. In other words, the nickel may remain due to a reduction of the nickel oxide.

Figure 10E:
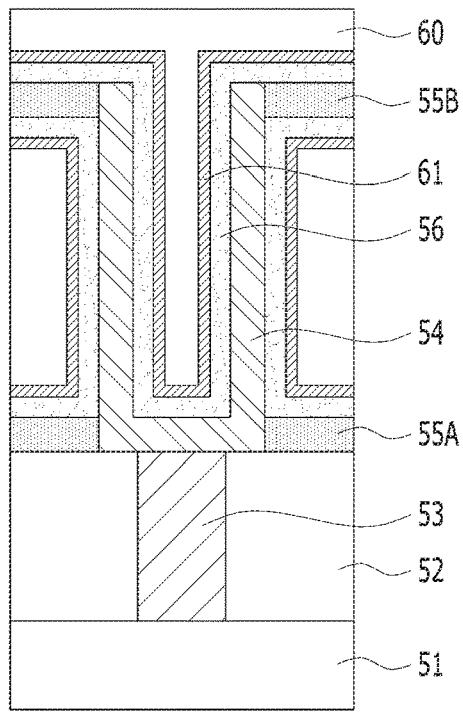

Referring to FIG. 10E, a top electrode 60 may be formed. The top electrode 60 may be or include a silicon germanium layer. When the top electrode 60 is formed, the sacrificial layer 59 and the initial interface layer 57' react due to the thermal budget. For example, an interface layer 61 may be formed through silicidation or a germanide reaction. The interface layer 61 may be a metal silicide or a metal germanide. The interface layer 61 may be a nickel silicide or a nickel germanide.

According to another embodiment of the present invention, the interface layer 61 of the DRAM capacitor may be formed of a metal-rich metal silicide.

According to another embodiment of the present invention, a method for forming the interface layer 61 of the DRAM capacitor may use a stack of a sacrificial interface layer and an auxiliary sacrificial interface layer. For example, the method for fabricating the DRAM capacitor may include the processes described above with reference to FIGS. 4A to 4C. Besides, the method for fabricating the DRAM capacitor may include the processes described above with reference to FIGS. 8A to 8C.

Figure 11:
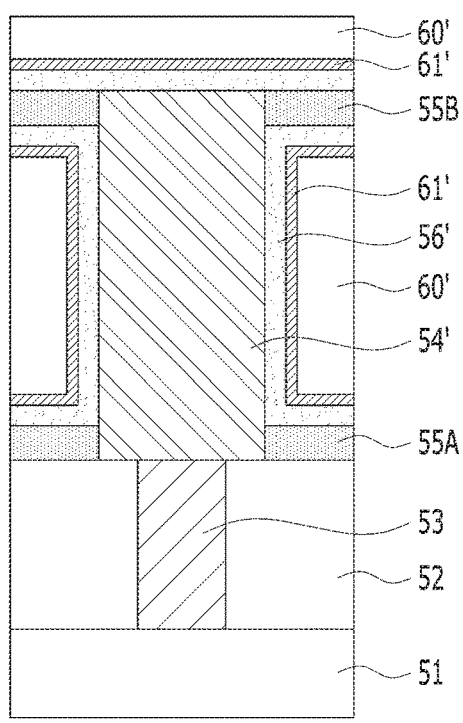
FIG. 11 is a cross-sectional view of the DRAM capacitor in accordance with an embodiment of the present invention.

FIG. 11 is a cross-sectional view of the DRAM capacitor in accordance with embodiments of the present invention.

Referring to FIG. 11, a pillar-type bottom electrode 54', a dielectric layer 56', an interface layer 61' and a top electrode 60' may be formed. The DRAM capacitor shown in FIG. 11 may be fabricated by the method described above with reference to FIGS. 10A to 10E. However, we note that the pillar-type bottom electrode 54' may be formed by a method that is different from the method for forming the bottom electrode 54 shown in FIG. 10A.

According to the embodiments of the present invention, the interface layer may be formed between the dielectric layer and the top electrode using a material having a high electronegativity, whereby the leakage current may be greatly reduced. Thus, refresh characteristics of the DRAM may be improved.

According to the embodiments of the present invention, since the equivalent oxide layer thickness and capacitance are not affected, a sensing margin of the DRAM may be maintained and the reliability of the DRAM may be improved.

According to various embodiments of the present invention, an interface layer having a high work function while suppressing the reduction of a dielectric layer may be formed.

Also, according to various embodiments of the present invention, an interface layer may be formed between a dielectric layer and a top electrode using a material having a high electronegativity, whereby the leakage current of a capacitor may be reduced.

Finally, according to various embodiments of the present invention, a dielectric layer may be prevented from being reduced from a top electrode, whereby the capacitance and the leakage current may be improved.

While the present invention has been described with respect to the specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A capacitor, comprising:
   a bottom electrode;
   a dielectric layer formed on the bottom electrode;
   a high work function interface layer formed on the dielectric layer; and
   a top electrode formed on the high work function interface layer,
   wherein the high work function interface layer includes a germanide having a high electronegativity, and
   wherein the top electrode is formed of a silicon germanium layer.

2. The capacitor of claim 1, wherein the high work function interface layer includes a metal germanide and the high work function interface layer has a work function of 4.9 eV or higher.

3. The capacitor of claim 1, wherein the high work function interface layer includes a nickel germanide, a cobalt germanide, or a tungsten germanide.

4. The capacitor of claim 1, wherein the top electrode includes a boron-doped silicon germanium layer.

5. The capacitor of claim 1, wherein the dielectric layer includes a zirconium oxide, an aluminum oxide, or a combination thereof.

6. The capacitor of claim 1, wherein the bottom electrode has a cylindrical shape or a pillar shape.

7. The capacitor of claim 1, wherein the bottom electrode includes a titanium nitride.

8. The capacitor of claim 1, wherein the dielectric layer includes ZAZA ($ZrO_2/Al_2O_3/ZrO_2/Al_2O_3$) stack.

9. The capacitor of claim 1, wherein the dielectric layer includes ZAZ ($ZrO_2/Al_2O_3/ZrO_2$), HAH ($HfO_2/Al_2O_3/HfO_2$), $TiO_2/ZrO_2/Al_2O_3/ZrO_2$, $TiO_2/HfO_2/Al_2O_3/HfO_2$, $Ta_2O_5/ZrO_2/Al_2O_3/ZrO_2$ or $Ta_2O_5/HfO_2/Al_2O_3/HfO_2$.

10. A capacitor, comprising:
    a bottom electrode;
    a dielectric layer formed on the bottom electrode;
    a high work function interface layer formed on the dielectric layer; and
    a top electrode formed on the high work function interface layer,
    wherein the high work function interface layer includes a metal germanide having a high electronegativity, and
    wherein the top electrode is formed of a non-metal material.

11. The capacitor of claim 10, wherein the top electrode includes a silicon germanium layer.

12. The capacitor of claim 10, wherein the top electrode includes a boron-doped silicon germanium layer.

13. The capacitor of claim 10, wherein the high work function interface layer includes a nickel germanide, a cobalt germanide, or a tungsten germanide.

14. The capacitor of claim 10, wherein the dielectric layer includes a zirconium oxide, an aluminum oxide, or a combination thereof.

15. The capacitor of claim 10, wherein the bottom electrode has a cylindrical shape or a pillar shape.

16. The capacitor of claim 10, wherein the bottom electrode includes a titanium nitride.

17. The capacitor of claim 10, wherein the dielectric layer includes ZAZA ($ZrO_2/Al_2O_3/ZrO_2/Al_2O_3$) stack.

18. The capacitor of claim 10, wherein the dielectric layer includes ZAZ ($ZrO_2/Al_2O_3/ZrO_2$), HAH ($HfO_2/Al_2O_3/HfO_2$), $TiO_2/ZrO_2/Al_2O_3/ZrO_2$, $TiO_2/HfO_2/Al_2O_3/HfO_2$, $Ta_2O_5/ZrO_2/Al_2O_3/ZrO_2$ or $Ta_2O_5/HfO_2/Al_2O_3/HfO_2$.

* * * * *